United States Patent
Chen et al.

(10) Patent No.: US 6,309,962 B1
(45) Date of Patent: Oct. 30, 2001

(54) FILM STACK AND ETCHING SEQUENCE FOR DUAL DAMASCENE

(75) Inventors: Chao-Cheng Chen, Matou; Li-Chi Chao, Yang-mei; Jen-Cheng Liu, Chia-Yih; Min-Huei Lui, Panchiao; Chia-Shiung Tsai, Hsin-chu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/396,516

(22) Filed: Sep. 15, 1999

(51) Int. Cl.[7] .................. H01L 21/4763; H01L 21/311; H01L 21/461

(52) U.S. Cl. ............... 438/638; 438/623; 438/624; 438/622; 438/740; 438/735; 438/700

(58) Field of Search ................. 438/634, 637, 438/638, 687, 688, 736, 737, 738, 740, 717, 735, 597, 622, 624, 623, 675, 700

(56) References Cited

U.S. PATENT DOCUMENTS

| | | | |
|---|---|---|---|
| 5,679,608 | 10/1997 | Cheung et al. | 437/195 |
| 5,801,094 | 9/1998 | Yew et al. | 438/624 |
| 5,817,572 | 10/1998 | Chiang et al. | 438/624 |
| 5,821,169 | 10/1998 | Nguyen et al. | 438/736 |
| 5,916,823 | * 6/1999 | Lou et al. | 438/738 |
| 5,920,790 | * 7/1999 | Wetzel et al. | 438/618 |
| 6,017,817 | * 1/2000 | Chung et al. | 438/637 |
| 6,025,259 | * 2/2000 | Yu et al. | 438/618 |

* cited by examiner

Primary Examiner—Charles Bowers
Assistant Examiner—T. Pham
(74) Attorney, Agent, or Firm—George O. Saile; Stephen B. Ackerman

(57) ABSTRACT

A process for forming a dual damascene cavity in a dielectric, particularly a low k organic dielectric, is described. The dielectric is composed of two layers separated by an etch stop layer. Formation of the damascene cavity is achieved by using a hard mask that is made up of two layers of silicon oxynitride separated by layer of silicon oxide. For both the trench first and via first approaches, the first cavity is formed using only the upper silicon oxynitride layer as the mask. Thus, when the second portion is patterned, little or no misalignment occurs because said upper layer is relatively thin. Additional etching steps result in a cavity and trench part that extend as far as the etch stop layer located between the dielectric layers. Final removal of photoresist occurs with a hard mask still in place so no damage to the organic dielectric occurs. A final etch step then completes the process.

18 Claims, 5 Drawing Sheets

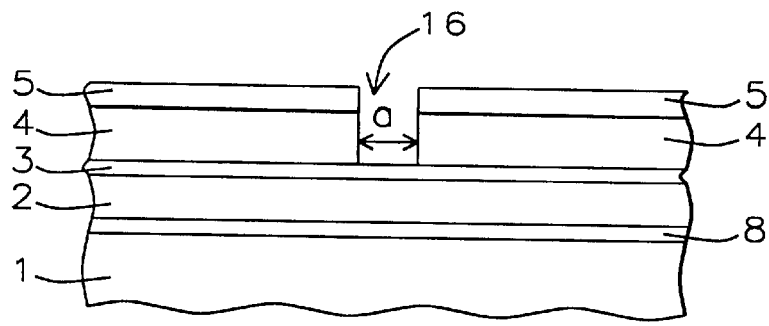
FIG. 1 – Prior Art
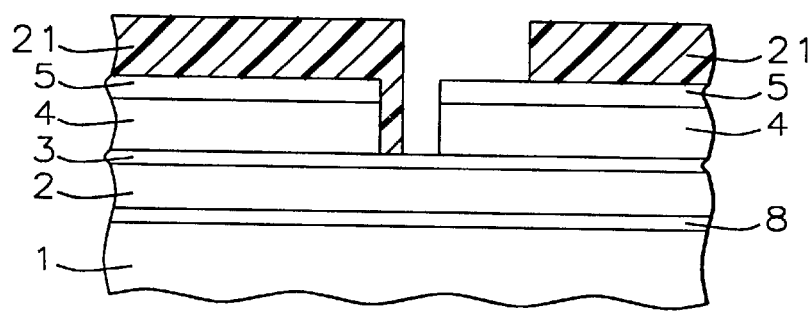
FIG. 2 – Prior Art
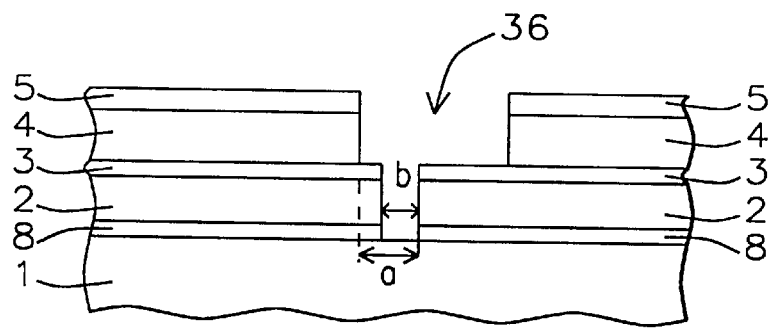
FIG. 3 – Prior Art

FILM STACK AND ETCHING SEQUENCE FOR DUAL DAMASCENE

FIELD OF THE INVENTION

The invention relates to the general field of integrated circuits with particular reference to trench and via hole formation for a dual damascene connector through a low k dielectric.

BACKGROUND OF THE INVENTION

The term damascene when used in connection with integrated circuit wiring, refers to the fact that a layer has been inlaid within a supporting medium, as opposed to being covered by it. The main advantage of this approach to wiring is that it is highly cost effective relative to conventional wiring. The word 'damascene' is derived from the city of Damascus where inlaid jewelry of this general format was first produced. Most commonly, a damascene structure consists of two portions—an upper trench shaped part in which wiring is laid and a lower via hole part that connects this wiring to a lower level—and is thus referred to as 'dual damascene'.

The present invention is concerned with how the trench and via hole openings are formed rather than how they are subsequently filled with metal. More particularly, the invention deals with the special case of organic dielectrics such as FLARE (fluorinated arylene ether) which are used in place of the more conventional inorganic dielectrics because they have lower k (dielectric constant) values.

A commonly used process of the poor art for forming the damascene cavities begins as illustrated in FIG. 1. The low k organic dielectric is actually formed from two layers 2 and 4, of roughly equal thickness, separated by an etch stop layer 3 of a material such as silicon oxide. These coat the top surface of partially formed integrated circuit wafer 1. A hard mask 5 of a single layer of silicon oxynitride, on the top surface of 4, has been etched to define, and then used to form, partial via hole 16 (diameter a) which extends as far as etch stop layer 3. Dielectric 8 separates layers 1 and 2.

Referring now to FIG. 2, photoresist mask 21 has been laid down to define the trench portion of the damascene structure. Ordinarily, this trench would fully encompass the via hole but, if some misalignment occurs, as shown in FIG. 3, mask 21 may overlap the via hole so that when the trench is etched out of layer 4, and the via hole is simultaneously extended down to level 1, the final via has diameter b which is less than the intended value a.

One approach that has been used in the prior art to avoid this problem has been to etch the trench first and to then form the via inside it. While this solves the problem discussed above for the case of low k organic dielectrics, forming a good photoresist mask within the trench is difficult because of the presence of a high step at the edge of the trench.

Finally, a problem associated with both the via first and trench first approaches, when used in conjunction with an organic dielectric, is that the same processes that are most effective for removing photoresist also attack other organic materials such as the low k dielectric The present invention offers solutions to all three problems discussed above. A routine search of the prior art was conducted but no references that teach the approach disclosed in the present invention were encountered. Several references that were of interest were, however, found. For example, Nguyen et al. (U.S. Pat. No. 5,821,169) use a combination dual layer hard mask and two layer photoresist mask to form their dual damascene opening. This approach mitigates the step problem associated with trench etching but does not protect a low k (organic) dielectric layer from being damaged during photoresist removal.

Cheung et al. (U.S. Pat. No. 5,679,608) describe a process for forming an IMD from an organic dielectric such as benzocyclobutene but the structure is not damascene. Yew et al. (U.S. Pat. No. 5,801,094) describe a process which enables the trench and via hole portions of a dual damascene structure to be etched out in a single step.

Chiang et al. (U.S. Pat. No. 5,817,572) first form and fill the via to form the stud portion of a dual damascene structure. This can then serve as an etch stop for forming the trench portion or an additional etch stop layer maybe added.

SUMMARY OF THE INVENTION

It has been an object of the present invention to provide a process for forming a cavity for use in a dual damascene structure.

Another object of the invention has been that said process be suited for use with low dielectric constant layers made from organic materials.

A further object of the invention has been that said low dielectric constant materials not be damaged during the removal of photoresist if photo rework is needed.

A still further object of the invention has been to minimize the incidence of misalignment during the via first process.

Yet another object of the invention has been to cover misalignment during the trench first process.

These objects of been achieved by using a dielectric that is composed of two layers separated by an etch stop layer. Formation of the damascene cavity is achieved by using a hard mask that is made up of two layers of silicon oxynitride separated by layer of silicon oxide. For both the trench first and via first approaches, the first cavity is formed using only the upper silicon oxynitride layer as the mask. Thus, when the second portion is patterned a good photoresist mask can be formed and misalignment is minimized because said upper layer is relatively thin. If photo rework is required at this stage, no damage is done to the organic dielectric during the photoresist removal process. Additional etching steps result in a cavity and trench part that extend as far as the etch stop layer located between the dielectric layers. A final etch step then completes the process.

BRIEF DESCRIPTION OF THE DRAWINGS

FIG. 1 shows the starting point of a prior art process for forming a damascene cavity.

FIG. 2 shows how the photoresist mask intended to define the trench portion can be misaligned with respect to the via portion.

FIG. 3 shows how the misalignment illustrated in FIG. 2 results in a via hole whose diameter is less than intended.

DESCRIPTION OF THE PREFERRED EMBODIMENTS

The present invention may be implemented in either the via first or trench first modes. Detailed examples of specific implementations of each will be presented below but it should be understood that the method is of a more general nature and its application is not limited to the particular materials and dimensions given in the examples. For example, although the method has been tailored for optimum damascene cavity formation in organic dielectrics, it would still work if used with inorganic dielectrics.

First Embodiment

Figure 4A:
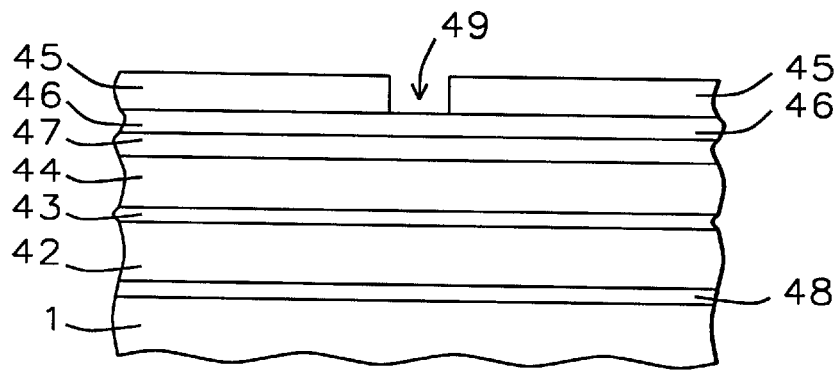
FIG. 4a shows the starting point for both embodiments of the present invention.

Referring now to FIG. 4, the process of the first embodiment begins with the provision of a partially completed integrated circuit shown schematically in the figure as layer 1 onto which the IMD has been deposited along with dielectric layer 48 (typically silicon nitride 300–1,000 Å thick) that separates the IMD from the underlying metal. The latter is a three layer structure made up of two dielectric layers 42 and 44, separated by etch stop layer 43. Any dielectric could be used but our preferred material has been fluorinated arylene ether (FLARE) or similar material such as, SiLK (Dow Chemical proprietary aromatic polymer), polyarylene ether (PAE), or benzocyclobutene (BCB). Dielectric layer 42 was deposited to a thickness between about 0.4 and 0.8 microns while layer 44 was deposited to a thickness between about 0.4 and 0.8 microns. For the etch stop layer we have preferred plasma enhanced silicon oxide deposited to a thickness between about 300 and 1,000 Angstroms.

Next, a three layer hard mask is laid down over the IMD. The three layers, deposited in sequence, are silicon oxynitride layers 45 and 47, separated by silicon oxide layer 46. Silicon oxynitrde layer 47 was deposited to a thickness between about 0.1 and 0.3 microns while layer 45 was deposited to a thickness between about 0.1 and 0.3 microns. The layer of silicon oxide 46 was deposited to a thickness between about 0.1 and 0.3 microns. We note here that a three layer, or even a two layer, hard mask is not an essential feature of the present invention. Thus, a hard mask composed of 0.1–0.3 microns silicon oxynitride on 0.1–0.3 microns of silicon oxide would be effective as would a single layer mask of 0.2–0.6 microns of silicon oxynitride. The three layer structure is preferred because it makes the etching step easier.

A photoresist mask (not shown) is then used to define via hole 49 and exposed portions of layer 45 are etched away down to the level of the silicon oxide layer 46, giving the structure the appearance seen in FIG. 4. Etching of the two silicon oxynitride layers 45 and 47 as well as silicon oxide layer 46 was accomplished using a mixture of carbon tetrafluoride (or methane tri-iodide), oxygen, and argon at a flow rate of about 50 to 100 SCCM for the $CF_4$, about 5–20 SCCM for the $O_2$, and about 50–200 SCCM for the Ar, at a pressure between about 40 and 100 mtorr, at a power level between about 500–1,500 watts, and a temperature between about 10 and 60° C. The photoresist is then removed.

Figure 4B:
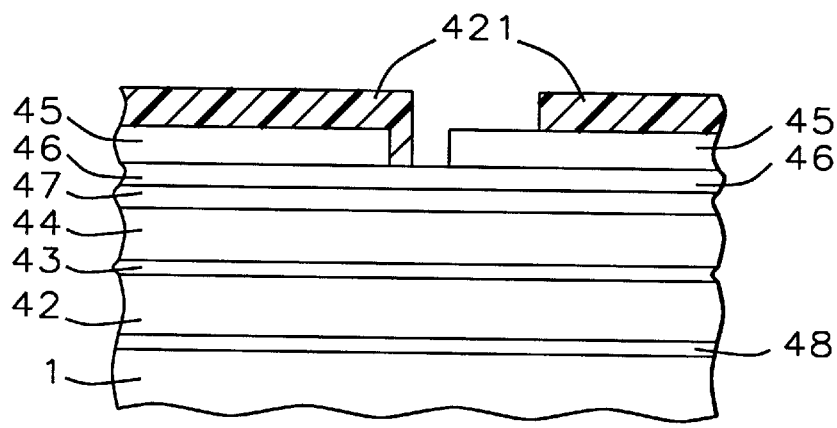
FIG. 4b shows how misalignment of the trench relative to the via serves to protect the via.
Figure 5:
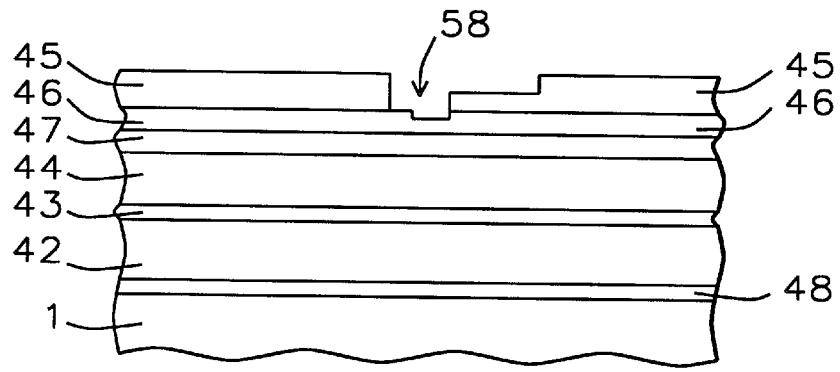
FIG. 5 shows how use of only the upper-most layer of the hard mask facilitates easy alignment of the trench portion relative to the via portion.
Figure 6:
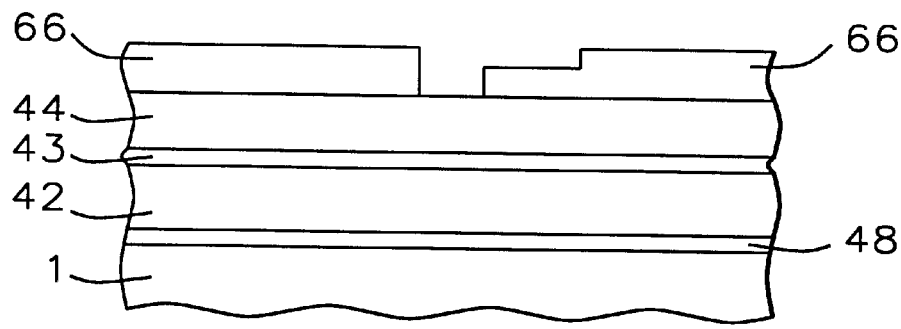
FIG. 6 shows the hard mask gets shaped into via and trench portions.

A second photoresist mask (not shown) is then used to define the trench 58 (see FIG. 5), some misalignment of the trench relative to the via being allowed such that part of the via hole is covered by photoresist 421, as shown in FIG. 4b. After etching and photoresist stripping, the structure has the appearance seen in FIG. 5 where three levels can be seen because the via is partly covered by photoresist and has thus not been etched as well as because of the etching selectivity between silicon oxide and silicon oxynitride. so layer 46 gets only lightly etched. Etching is continued (without photoresist) so that both the via and trench parts grow in depth. Etching is terminated when the bottom of the via part reaches the level of upper dielectric layer 44. This is illustrated in FIG. 6 where the two oxynitride layers and their intermediate oxide layer have been merged and are represented as hard mask 66. It can be seen that at this stage, due to the etching selectivity between the hard mask and the organic dielectric, that the misalignment problem is automatically solved—a feature of the present invention.

Figure 7:
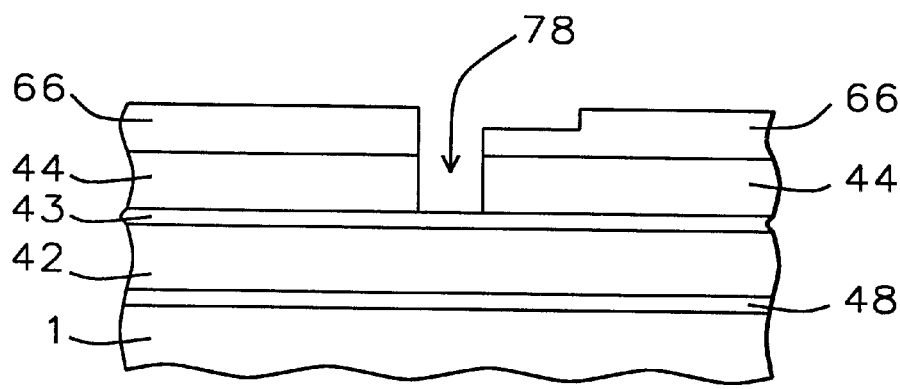
FIG. 7 shows the partially formed via in the upper half of the IMD.
Figure 8:
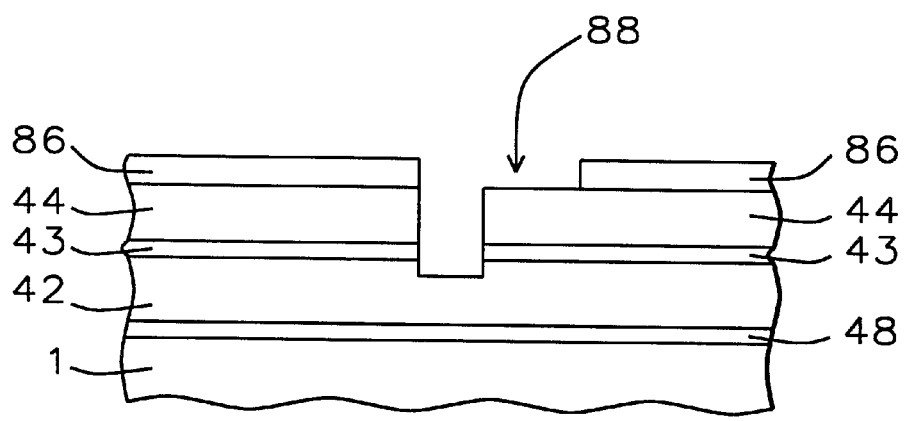
FIGS. 8 and 9 show the final stages, ending up with the intended damascene cavity.

All photoresist is now removed, with layer 44 being protected by hard mask 66, and then the upper dielectric layer 44 is etched down to etch stop layer 43, as illustrated in FIG. 7.

Figure 9:
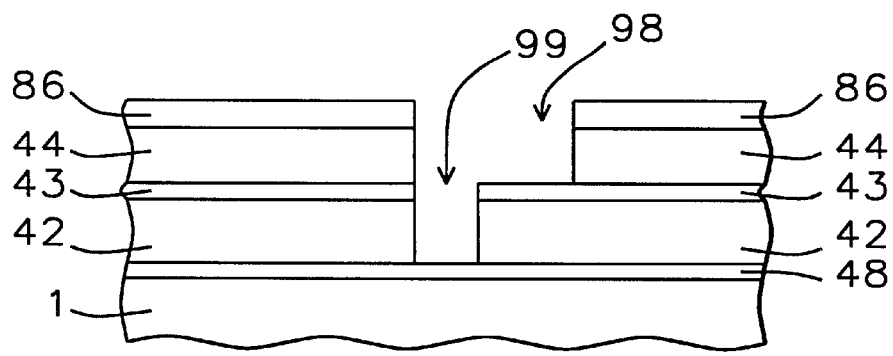

The portion of etch stop layer 43 that has been exposed at the bottom of via 78 is now removed by etching as above: at a flow rate of about 50 to 100 SCCM for $CF_4$, about 5–20 SCCM for $O_2$, and about 50–200 SCCM for Ar, at a pressure between about 40 and 100 mtorr, at a power level between about 500–1,500 watts, and a temperature between about 10 and 60° C. In addition to 43, the etchant also removes material at the bottom of the trench, some material from hard mask 66 and a small amount of lower dielectric 42. The structure at this stage is illustrated in FIG. 9 with reduced hard mask 66 renamed 86.

Then, both dielectric layers 42 and 44 are etched, by means of a mixture of nitrogen and hydrogen or oxygen (about 5–200 SCCM for $N_2$ and about 50–200 SCCM for $H_2$, at a pressure between about 50 and 500 mtorr, at a power level between about 500–1,500 watts, and a temperature between about 10 and 60° C.). This causes completed via 99 to extend through 42 down to the level of integrated circuit 1 and completed trench 98 to extend down to the level of etch stop layer 43. Finally, dielectric layer 48 is removed using difluoromethane ($CH_2F_2$) at 20–80 SCCM, $CF_4$ at 10–50 SCCM, and $O_2$ at 5–30 SCCM, at a pressure between about 50 and 150 mtorr, at a power level between about 500–1,500 watts, and a temperature between about 50 and 200° C. This is illustrated in FIG. 9.

Second Embodiment

Figure 10:
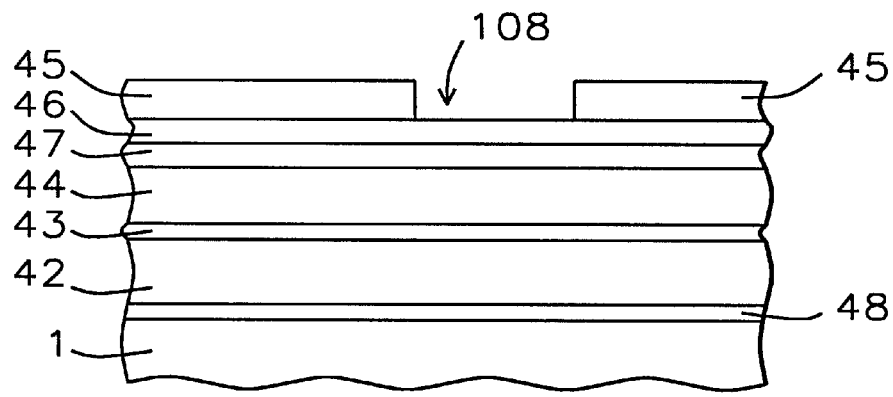
FIG. 10 shows the starting point for a second embodiments of the invention wherein the trench portion is formed first.

Referring now to FIG. 10, the process of the second embodiment begins, as in the first embodiment, with the provision of a partially completed integrated circuit shown schematically in the figure as layer 1 onto which the IMD has been deposited as well as dielectric layer 48 (typically silicon nitride 300–1,000Å thick) that separates the IMD from the underlying metal. The latter is a three layer structure made up of two dielectric layers 42 and 44, separated by etch stop layer 43. Any dielectric could be used but our preferred material has been fluorinated arylene ether (FLARE) or a similar material such as, SILK (Dow Chemical proprietary aromatic polymer), polyarylene ether (PAE), or benzo-cydobutene (BCB). Dielectric layer 42 was deposited to a thickness between about 0.4 and 0.8 microns while layer 44 was deposited to a thickness between about 0.4 and 0.8 microns. For the etch stop layer we have preferred plasma enhanced silicon oxide deposited to a thickness between about 300 and 1,000 Angstroms.

Next, a three layer hard mask is laid down over the IMD. The three layers, deposited in sequence, are silicon oxynitride layers 45 and 47, separated by silicon oxide layer 46. Silicon oxynitride layer 47 was deposited to a thickness between about 0.1 and 0.3 microns while layer 45 was deposited to a thickness between about 0.1 and 0.3 microns. The layer of silicon oxide 46 was deposited to a thickness between about 0.1 and 0.3 microns.

A photoresist mask (not shown) is then used to define trench 108 and exposed portions of layer 45 are etched away down to the level of the silicon oxide layer 46, giving the structure the appearance seen in FIG. 10. Etching of silicon oxynitride layer 45 was accomplished using a mixture of carbon tetrafluoride, oxygen, and argon at a flow rate of about 50 to 100 SCCM for $CF_4$, about 5–20 SCCM for $O_2$, and about 50–200 SCCM for Ar, at a pressure between about 40 and 100 mtorr, at a power level between about 500–1,500 watts, and a temperature between about 10 and 60° C. The photoresist was then removed.

Figure 11:
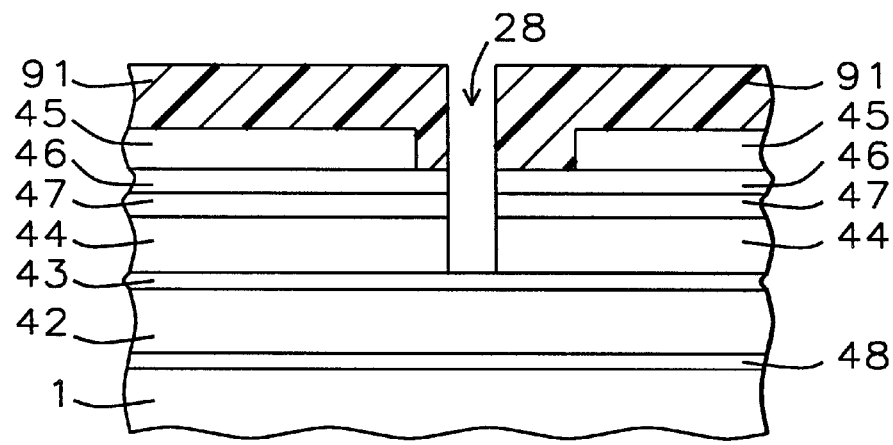
FIG. 11 shows how step height at the edge of the trench is minimized, thereby facilitating use of photoresist to define the via portion.

Photoresist mask 91, that defines a via hole located wholly within trench 108 was then laid down as shown in FIG. 11. At this stage of the process, the trench is relatively shallow so there is no problem with photoresist 91 having to cope with a high step at the trench's edge. Etching of the exposed parts of layers 46 and 47 is now initiated, being accomplished by using a mixture of carbon tetrafluoride, oxygen, and argon at a flow rate of about 50 to 100 SCCM for $CF_4$, about 5–20 SCCM for $O_2$, and about 50–200 SCCM for Ar, at a pressure between about 40 and 100 mtorr, at a power level between about 500–1,500 watts, and a temperature between about 10 and 60° C. This was continued until via 28 had penetrated a short distance into upper dielectric layer 44. The etching procedure was then changed to a mixture of nitrogen and hydrogen or nitrogen and oxygen until the formation of via hole 28 stopped at dielectric 43. Photoresist layer 91 was also removed as part of this etching step.

Figure 12:
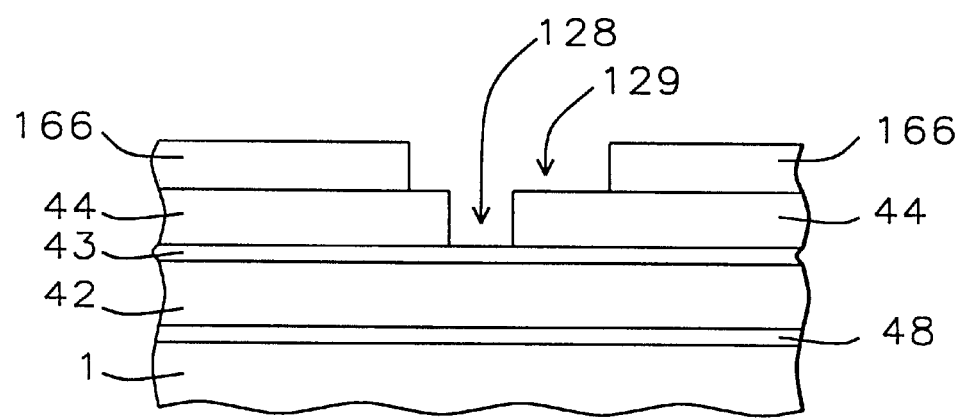
FIG. 12 illustrates the penultimate step of the process with both trench and via partly formed.
Figure 13:
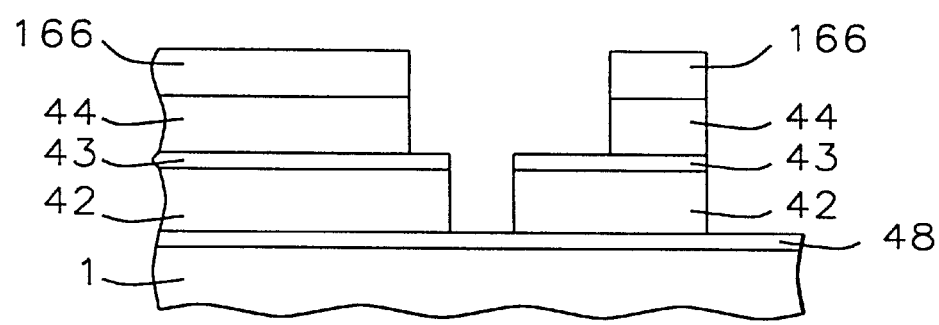
FIG. 13 illustrates the appearance of the structure at the conclusion of the process.

Referring now to FIG. 12, where the three layers 45, 46, and 47 are schematically shown as a single hard mask 166. Using said hard mask, upper dielectric layer 44 is etched away by means of a mixture of nitrogen and hydrogen or nitrogen and oxygen (about 501–200 SCCM for $N_2$ and about 50–200 SCCM for $H_2$, at a pressure between about 50 and 500 mtorr, at a power level between about 500–1,500 watts, and a temperature between about 10 and 60° C). This could also have been achieved using alternative reagents such as $CH_3F_2$, $C_4F_8$, or $CH_3F$. Then, after a short etching step to remove etch stop layer 43 from the bottom of via 128, both dielectric layers 42 and 44 were etched. This causes completed via 128 to extend through 42 down to the level of integrated circuit 1 and trench 129 to extend down to the level of etch stop layer 43, giving the structure an appearance similar to that shown in FIG. 13. Finally, etch stop layer 48 is removed (C2H2F2 20–80 SCCM, O2 5–30 SCCM, $CF_4$ 10–50 SCCM, and Ar 50–200 SCCM at 50–150 mtorr, 500–1,500 watts, and 10–60° C.) to obtain contact with the underlayer metal.

While the invention has been particularly shown and described with reference to the preferred embodiments thereof, it will be understood by those skilled in the art that various changes in form and details may be made without departing from the spirit and scope of the invention.

What is claimed is:

1. A process for forming a dual damascene cavity, that comprises a via hole and a trench, in a first dielectric layer, comprising:

forming said dielectric layer from first upper and lower layers separated by a first etch stop layer;

forming, on said first upper dielectric layer, a hard mask layer that further comprises second upper and lower dielectric layers, separated by a second etch stop layer;

patterning and etching the upper second dielectric layer to form an incomplete via hole that extends as far as the second etch stop layer and then removing any exposed portions of the second etch stop layer;

patterning and etching the hard mask to form an incomplete trench that extends as far as the second etch stop layer thereby causing the via hole to extend as far as said first upper dielectric layer; and selectively etching all exposed surfaces whereby the via hole extends through the first lower dielectric layer and the trench extends as far as the first etch stop layer.

2. A process for forming a dual damascene cavity, that comprises a via hole and a trench, in a first dielectric layer, comprising:

forming said dielectric layer from first upper and lower layers separated by a first etch stop layer;

forming, on said first upper dielectric layer, a hard mask layer that further comprises second upper and lower dielectric layers, separated by a second etch stop layer;

patterning and etching the upper second dielectric layer to form an incomplete trench that extends as far as the second etch stop layer and then removing any exposed portions of the second etch stop layer;

patterning and etching the hard mask to form an incomplete via hole that extends as far as the first upper dielectric layer wherein the via hole is defined inside the trench; and selectively etching all exposed surfaces whereby the via hole extends through the first lower dielectric layer and the trench extends as far as the first etch stop layer.

3. A process for forming a trench and via cavity, comprising:

providing a partially completed integrated circuit;

depositing, in sequence on said integrated circuit, a first dielectric layer, an etch stop layer, and a second dielectric layer;

depositing a first layer of silicon oxynitride on said second dielectric layer;

depositing a layer of silicon oxide on said first layer of silicon oxynitride;

depositing a second layer of silicon oxynitride on the layer of silicon oxide;

laying down a first photoresist mask that defines a via hole, then etching the second layer of silicon oxynitride down to the level of the silicon oxide, and then removing the photoresist;

laying down a second photoresist mask that defines a trench which encompasses said via hole;

then etching the first and second silicon oxynitride layers and the silicon oxide layer down to the level of the second dielectric layer;

removing all photoresist and then, using the first and second silicon oxynitride layers as a hard mask, etching the second dielectric layer down to the etch stop layer;

removing all exposed portions of the etch stop layer; and etching the first and second dielectric layers until the trench extends as far as the etch stop layer and the via hole extends down to the level of the integrated circuit.

4. The process of claim 3 wherein said first and second dielectric layers are selected from the group consisting of fluorinated arylene ether, polyarylene ether and benzocyclobutene.

5. The process of claim 3 wherein the etch stop layer is plasma enhanced silicon oxide that is deposited to a thickness between about 300 and 1,000 Angstroms.

6. The process of claim 3 wherein said first dielectric layer is deposited to a thickness between about 0.4 and 0.8 microns and said second dielectric layer is deposited to a thickness between about 0.4 and 0.8 microns.

7. The process of claim 3 wherein said first layer of silicon oxynitride is deposited to a thickness between about 0.1 and 0.3 microns and said second layer of silicon oxynitride is deposited to a thickness between about 0.1 and 0.3 microns.

8. The process of claim 3 wherein said layer of silicon oxide is deposited to a thickness between about 0.1 and 0.3 microns.

9. The process of claim 3 wherein the step of etching the first and second silicon oxynitride layers and the silicon oxide layer further comprises using a mixture of carbon tetrafluoride, oxygen, and argon at a flow rate of about 50 to 100 SCCM for the $CF_4$, about 5–20 SCCM for the $O_2$, and about 50–200 SCCM for the Ar, at a pressure between about 40 and 100 mtorr, at a power level between about 500–1,500 watts, and a temperature between about 10 and 60° C.

10. The process of claim 3 wherein the step of etching the first and second dielectric layers further comprises using a mixture of nitrogen and hydrogen or oxygen at about 5–200 SCCM for $N_2$ and about 50–200 SCCM for $H_2$, at a pressure between about 50 and 500 mtorr, at a power level between about 500–1,500 watts, and a temperature between about 10 and 60° C.

11. A process for forming a trench and via cavity, comprising:

providing a partially completed integrated circuit;

depositing, in sequence on said integrated circuit, a first dielectric layer, an etch stop layer, and a second dielectric layer;

depositing a first layer of silicon oxynitride on said second dielectric layer;

depositing a layer of silicon oxide on said first layer of silicon oxynitride;

depositing a second layer of silicon oxynitride on the layer of silicon oxide;

laying down a first photoresist mask that defines a trench, then etching the second layer of silicon oxynitride down to the level of the silicon oxide, and then removing the photoresist;

laying down a second photoresist mask that defines a via hole that is wholly within said trench;

then etching the first silicon oxynitride layer and the silicon oxide layer down to the level of the second dielectric layer;

removing all photoresist and then, using the first and second silicon oxynitride layers as a hard mask, etching the second dielectric layer down to the etch stop layer;

removing all exposed portions of the etch stop layer; and etching the first and second dielectric layers until the trench extends as far as the etch stop layer and the via hole extends down to the level of the integrated circuit.

12. The process of claim 11 wherein said first and second dielectric layers are selected from the group consisting of fluorinated arylene ether, polyarylene ether and benzocyclobutene.

13. The process of claim 11 wherein the etch stop layer is plasma enhanced silicon oxide that is deposited to a thickness between about 300 and 1,000 Angstroms.

14. The process of claim 11 wherein said first dielectric layer is deposited to a thickness between about 0.4 and 0.8 microns and said second dielectric layer is deposited to a thickness between about 0.4 and 0.8 microns.

15. The process of claim 11 wherein said first layer of silicon oxynitride is deposited to a thickness between about 0.1 and 0.3 microns and said second layer of silicon oxynitride is deposited to a thickness between about 0.1 and 0.3 microns.

16. The process of claim 11 wherein said layer of silicon oxide is deposited to a thickness between about 0.1 and 0.3 microns.

17. The process of claim 11 wherein the step of etching the first and second silicon oxynitride layers and the silicon oxide layer further comprises using a mixture of carbon tetrafluoride, oxygen, and argon at a flow rate of about 50 to 100 SCCM for the $CF_4$, about 5–20 SCCM for the $O_2$, and about 50–200 SCCM for the Ar, at a pressure between about 40 and 100 mtorr, at a power level between about 500–1,500 watts, and a temperature between about 10 and 60° C.

18. The process of claim 11 wherein the step of etching the first and second dielectric layers further comprises using a mixture of nitrogen and hydrogen or nitrogen and oxygen at about 5–200 SCCM for $N_2$ and about 50–200 SCCM for $H_2$, at a pressure between about 50 and 500 mtorr, at a power level between about 500–1,500 watts, and a temperature between about 10 and 60° C.

* * * * *